(12) United States Patent
Song et al.

(10) Patent No.: US 11,475,937 B2
(45) Date of Patent: Oct. 18, 2022

(54) DIE VOLTAGE REGULATION

(71) Applicant: Micron Technology, Inc., Boise, ID (US)

(72) Inventors: Taeksang Song, San Jose, CA (US); Saira S. Malik, Lafayette, IN (US); Hyunyoo Lee, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/338,458

(22) Filed: Jun. 3, 2021

(65) Prior Publication Data
US 2021/0407572 A1 Dec. 30, 2021

Related U.S. Application Data

(60) Provisional application No. 63/044,237, filed on Jun. 25, 2020.

(51) Int. Cl.
*G11C 11/4074* (2006.01)
*H01L 25/065* (2006.01)
*H01L 27/108* (2006.01)
*H02M 3/156* (2006.01)

(52) U.S. Cl.
CPC ........ *G11C 11/4074* (2013.01); *H01L 25/065* (2013.01); *H01L 27/10897* (2013.01); *H02M 3/156* (2013.01)

(58) Field of Classification Search
None
See application file for complete search history.

(56) References Cited

U.S. PATENT DOCUMENTS

| 6,849,951 B1 * | 2/2005 | Trimberger | H01L 23/642 257/734 |
| 2016/0190113 A1 * | 6/2016 | Sharan | H01L 21/78 257/532 |

\* cited by examiner

*Primary Examiner* — James G Norman
(74) *Attorney, Agent, or Firm* — Holland & Hart LLP

(57) ABSTRACT

Methods, systems, and devices for die voltage regulation are described. A device may include a first die and second die. A component that generates voltage on the first die may be connected to a capacitor on the second die through a conductive line. The conductive line may allow the capacitor on the second die to regulate voltage generated by the component on the first die.

23 Claims, 6 Drawing Sheets

DIE VOLTAGE REGULATION

CROSS REFERENCE

The present application for patent claims the benefit of U.S. Provisional Patent Application No. 63/044,237 by Song et al., entitled "DIE VOLTAGE REGULATION," filed Jun. 25, 2020, which is assigned to the assignee hereof, and which is expressly incorporated by reference herein.

BACKGROUND

The following relates generally to one or more systems and more specifically to die voltage regulation in a memory subsystem.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A device, such as an electronic device, may include multiple dies that provide different functionality. For example, the device may include a first die that is a logic die that provides processing functionality or a non-volatile memory die that serves as memory for the electronic device. To operate, the first die may use various voltages that are generated by one or more components on the first die. For example, the first die may include voltage sources, voltage pumps, low-dropout (LDO) voltage regulators, input/output (I/O) components, or other components (or any combination thereof) that output voltage for use by the first die. In some cases, the voltages generated by the components on the first die may be regulated by a capacitor so that the voltages do not deviate from within a threshold of an operating range. But including a capacitor on the first die to regulate the voltages may waste space on the first die or be cost-prohibitive, among other disadvantages. And additionally or alternatively, regulating the voltages using a discrete, stand-alone capacitor that is external to the first die may increase the size of the package that contains the first die and the external capacitor, which may be undesirable for various applications (e.g., mobile applications).

According to the techniques described herein, a capacitor on a second die may be used to regulate the voltage produced by one or more components on the first die. The capacitor may be similar to one or more other capacitors of volatile memory cells on the second die, which may be a DRAM die. Use of the capacitor on the second die may be more cost-effective and space-efficient relative to use of an internal capacitor on the first die, and the capacitor may be lower profile relative to a standalone discrete external capacitor, among other advantages. To enable voltage regulation by the capacitor on the second die, one or more conductive lines may connect the capacitor to the component that generates the voltage to be regulated. In some examples, the capacitor may be isolated from one or more components (e.g., memory cells and associated access circuitry) on the second die, which may increase the reliability of the capacitor (e.g., by limiting the capacitor's exposure to voltages for which it is rated).

Features of the disclosure are initially described in the context of a system and subsystem as described with reference to FIGS. 1 and 2. Features of the disclosure are described in the context of dies and devices as described with reference to FIGS. 3 through 5. These and other features of the disclosure are further illustrated by and described with reference to an apparatus diagram and flowcharts that relate to die voltage regulation as described with reference to FIGS. 6 and 7.

Figure 1:
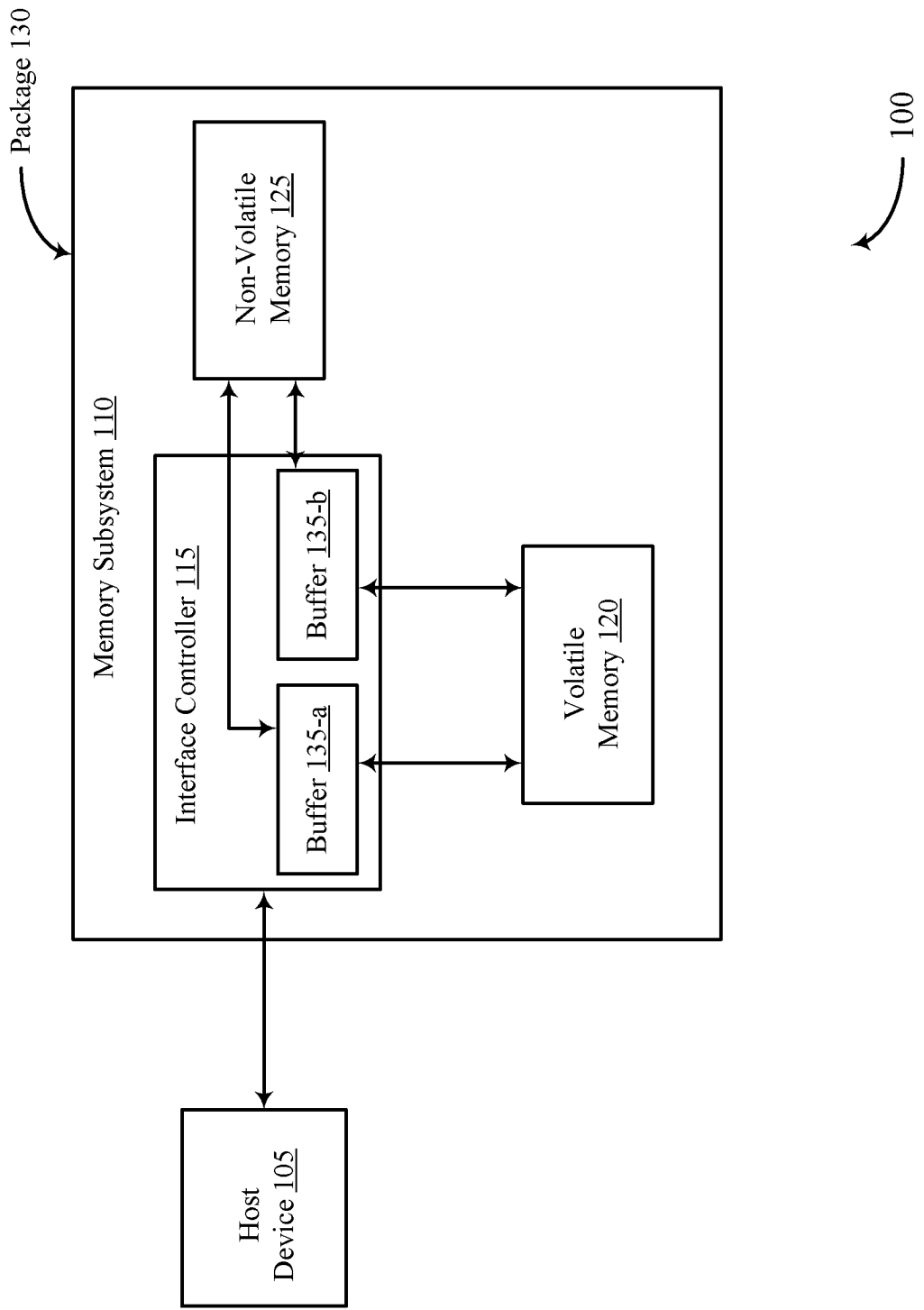
FIG. 1 illustrates an example of a system that supports die voltage regulation in accordance with examples as disclosed herein.

FIG. 1 illustrates an example of a system 100 that supports die voltage regulation in accordance with examples as disclosed herein. The system 100 may be included in an electronic device such a computer or phone. The system 100 may include a host device 105 and a memory subsystem 110. The host device 105 may be a processor or system-on-a-chip (SoC) that interfaces with the interface controller 115 as well as other components of the electronic device that includes the system 100. The memory subsystem 110 may store and provide access to electronic information (e.g., digital information, data) for the host device 105. The memory subsystem 110 may include an interface controller 115, a volatile memory 120, and a non-volatile memory 125. In some examples, the interface controller 115, the volatile memory 120, and the non-volatile memory 125 may be included in a same physical package such as a package 130. However, the interface controller 115, the volatile memory 120, and the non-volatile memory 125 may be disposed on different, respective dies (e.g., silicon dies).

The devices in the system 100 may be coupled by various conductive lines (e.g., traces, printed circuit board (PCB) routing, redistribution layer (RDL) routing) that may enable the communication of information (e.g., commands, addresses, data) between the devices. The conductive lines may make up channels, data buses, command buses, address buses, and the like.

The memory subsystem 110 may be configured to provide the benefits of the non-volatile memory 125 while maintaining compatibility with a host device 105 that supports protocols for a different type of memory, such as the volatile memory 120, among other examples. For example, the non-volatile memory 125 may provide benefits (e.g., relative to the volatile memory 120) such as non-volatility, higher capacity, or lower power consumption. But the host device 105 may be incompatible or inefficiently configured with various aspects of the non-volatile memory 125. For instance, the host device 105 may support voltages, access latencies, protocols, page sizes, etc. that are incompatible with the non-volatile memory 125. To compensate for the incompatibility between the host device 105 and the non-volatile memory 125, the memory subsystem 110 may be configured with the volatile memory 120, which may be compatible with the host device 105 and serve as a cache for the non-volatile memory 125. Thus, the host device 105 may use protocols supported by the volatile memory 120 while benefitting from the advantages of the non-volatile memory 125.

In some examples, the system 100 may be included in, or coupled with, a computing device, electronic device, mobile computing device, or wireless device. The device may be a portable electronic device. For example, the device may be a computer, a laptop computer, a tablet computer, a smartphone, a cellular phone, a wearable device, an internet-connected device, or the like. In some examples, the device may be configured for bi-directional wireless communication via a base station or access point. In some examples, the device associated with the system 100 may be capable of machine-type communication (MTC), machine-to-machine (M2M) communication, or device-to-device (D2D) communication. In some examples, the device associated with the system 100 may be referred to as a user equipment (UE), station (STA), mobile terminal, or the like.

The host device 105 may be configured to interface with the memory subsystem 110 using a first protocol (e.g., low-power double data rate (LPDDR)) supported by the interface controller 115. Thus, the host device 105 may, in some examples, interface with the interface controller 115 directly and the non-volatile memory 125 and the volatile memory 120 indirectly. In alternative examples, the host device 105 may interface directly with the non-volatile memory 125 and the volatile memory 120. The host device 105 may also interface with other components of the electronic device that includes the system 100. The host device 105 may be or include an SoC, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host.

The interface controller 115 may be configured to interface with the volatile memory 120 and the non-volatile memory 125 on behalf of the host device 105 (e.g., based on one or more commands or requests issued by the host device 105). For instance, the interface controller 115 may facilitate the retrieval and storage of data in the volatile memory 120 and the non-volatile memory 125 on behalf of the host device 105. Thus, the interface controller 115 may facilitate data transfer between various subcomponents, such as between at least some of the host device 105, the volatile memory 120, or the non-volatile memory 125. The interface controller 115 may interface with the host device 105 and the volatile memory 120 using the first protocol and may interface with the non-volatile memory 125 using a second protocol supported by the non-volatile memory 125.

The non-volatile memory 125 may be configured to store digital information (e.g., data) for the electronic device that includes the system 100. Accordingly, the non-volatile memory 125 may include an array or arrays of memory cells and a local memory controller configured to operate the array(s) of memory cells. In some examples, the memory cells may be or include FeRAM cells (e.g., the non-volatile memory 125 may be FeRAM). The non-volatile memory 125 may be configured to interface with the interface controller 115 using the second protocol that is different than the first protocol used between the interface controller 115 and the host device 105. In some examples, the non-volatile memory 125 may have a longer latency for access operations than the volatile memory 120. For example, retrieving data from the non-volatile memory 125 may take longer than retrieving data from the volatile memory 120. Similarly, writing data to the non-volatile memory 125 may take longer than writing data to the volatile memory 120. In some examples, the non-volatile memory 125 may have a smaller page size than the volatile memory 120, as described herein.

The volatile memory 120 may be configured to operate as a cache for one or more components, such as the non-volatile memory 125. For example, the volatile memory 120 may store information (e.g., data) for the electronic device that includes the system 100. Accordingly, the volatile memory 120 may include an array or arrays of memory cells and a local memory controller configured to operate the array(s) of memory cells. In some examples, the memory cells may be or include DRAM cells (e.g., the volatile memory may be DRAM). The non-volatile memory 125 may be configured to interface with the interface controller 115 using the first protocol that is used between the interface controller 115 and the host device 105.

In some examples, the volatile memory 120 may have a shorter latency for access operations than the non-volatile memory 125. For example, retrieving data from the volatile memory 120 may take less time than retrieving data from the non-volatile memory 125. Similarly, writing data to the volatile memory 120 may take less time than writing data to the non-volatile memory 125. In some examples, the volatile memory 120 may have a larger page size than the non-volatile memory 125. For instance, the page size of volatile memory 120 may be 2 kilobytes (2 kB) and the page size of non-volatile memory 125 may be 64 bytes (64B) or 128 bytes (128B).

Although the non-volatile memory 125 may be a higher-density memory than the volatile memory 120, accessing the non-volatile memory 125 may take longer than accessing the volatile memory 120 (e.g., due to different architectures and protocols, among other reasons). Accordingly, operating the volatile memory 120 as a cache may reduce latency in the system 100. As an example, an access request for data from the host device 105 may be satisfied relatively quickly by retrieving the data from the volatile memory 120 rather than from the non-volatile memory 125. To facilitate operation of the volatile memory 120 as a cache, the interface controller 115 may include multiple buffers 135. The buffers 135 may be disposed on the same die as the interface controller 115 and may be configured to temporarily store data for transfer between the volatile memory 120, the non-volatile memory 125, or the host device 105 (or any combination thereof) during one or more access operations (e.g., storage and retrieval operations).

An access operation may also be referred to as an access process or access procedure and may involve one or more sub-operations that are performed by one or more of the components of the memory subsystem 110. Examples of access operations may include storage operations in which data provided by the host device 105 is stored (e.g., written to) in the volatile memory 120 or the non-volatile memory 125 (or both), and retrieval operations in which data requested by the host device 105 is obtained (e.g., read) from the volatile memory 120 or the non-volatile memory 125 and is returned to the host device 105.

To store data in the memory subsystem 110, the host device 105 may initiate a storage operation (or "storage process") by transmitting a storage command (also referred to as a storage request, a write command, or a write request) to the interface controller 115. The storage command may target a set of non-volatile memory cells in the non-volatile memory 125. In some examples, a set of memory cells may also be referred to as a portion of memory. The host device 105 may also provide the data to be written to the set of non-volatile memory cells to the interface controller 115. The interface controller 115 may temporarily store the data in the buffer 135-*a*. After storing the data in the buffer 135-*a*, the interface controller 115 may transfer the data from the buffer 135-*a* to the volatile memory 120 or the non-volatile memory 125 or both. In write-through mode, the interface controller 115 may transfer the data to both the volatile memory 120 and the non-volatile memory 125. In write-back mode, the interface controller 115 may only transfer the data to the volatile memory 120.

In either mode, the interface controller 115 may identify an appropriate set of one or more volatile memory cells in the volatile memory 120 for storing the data associated with the storage command. To do so, the interface controller 115 may implement set-associative mapping in which each set (e.g., block) of one or more non-volatile memory cells in the non-volatile memory 125 may be mapped to multiple sets of volatile memory cells in the volatile memory 120. For instance, the interface controller 115 may implement n-way associative mapping which allows data from a set of non-volatile memory cells to be stored in one of n sets of volatile memory cells in the volatile memory 120. Thus, the interface controller 115 may manage the volatile memory 120 as a cache for the non-volatile memory 125 by referencing the n sets of volatile memory cells associated with a targeted set of non-volatile memory cells. As used herein, a "set" of objects may refer to one or more of the objects unless otherwise described or noted. Although described with reference to set-associative mapping, the interface controller 115 may manage the volatile memory 120 as a cache by implementing one or more other types of mapping such as direct mapping or associative mapping, among other examples.

After determining which n sets of volatile memory cells are associated with the targeted set of non-volatile memory cells, the interface controller 115 may store the data in one or more of the n sets of volatile memory cells. This way, a subsequent retrieval command from the host device 105 for the data can be efficiently satisfied by retrieving the data from the lower-latency volatile memory 120 instead of retrieving the data from the higher-latency non-volatile memory 125. The interface controller 115 may determine which of then sets of the volatile memory 120 to store the data based on one or more parameters associated with the data stored in the n sets of the volatile memory 120, such as the validity, age, or modification status of the data. Thus, a storage command by the host device 105 may be wholly (e.g., in write-back mode) or partially (e.g., in write-through mode) satisfied by storing the data in the volatile memory 120. To track the data stored in the volatile memory 120, the interface controller 115 may store for one or more sets of volatile memory cells (e.g., for each set of volatile memory cells) a tag address that indicates the non-volatile memory cells with data stored in a given set of volatile memory cells.

To retrieve data from the memory subsystem 110, the host device 105 may initiate a retrieval operation (also referred to as a retrieval process) by transmitting a retrieval command (also referred to as a retrieval request, a read command, or a read request) to the interface controller 115. The retrieval command may target a set of one or more non-volatile memory cells in the non-volatile memory 125. Upon receiving the retrieval command, the interface controller 115 may check for the requested data in the volatile memory 120. For instance, the interface controller 115 may check for the requested data in the n sets of volatile memory cells associated with the targeted set of non-volatile memory cells. If one of the n sets of volatile memory cells stores the requested data (e.g., stores data for the targeted set of non-volatile memory cells), the interface controller 115 may transfer the data from the volatile memory 120 to the buffer 135-*a* (e.g., in response to determining that one of the n sets of volatile memory cells stores the requested data) so that it can be transmitted to the host device 105. The term "hit" may be used to refer to the scenario where the volatile memory 120 stores data requested by the host device 105. If then sets of one or more volatile memory cells do not store the requested data (e.g., the n sets of volatile memory cells store data for a set of non-volatile memory cells other than the targeted set of non-volatile memory cells), the interface controller 115 may transfer the requested data from the non-volatile memory 125 to the buffer 135-*a* (e.g., in response to determining that the n sets of volatile memory cells do not store the requested data) so that it can be transmitted to the host device 105. The term "miss" may be used to refer to the scenario where the volatile memory 120 does not store data requested by the host device 105.

In a miss scenario, after transferring the requested data to the buffer 135-*a*, the interface controller 115 may transfer the requested data from the buffer 135-*a* to the volatile memory 120 so that subsequent read requests for the data can be satisfied by the volatile memory 120 instead of the non-volatile memory 125. For example, the interface controller 115 may store the data in one of the n sets of volatile memory cells associated with the targeted set of non-volatile memory cells. But the n sets of volatile memory cells may already be storing data for other sets of non-volatile memory cells. So, to preserve this other data, the interface controller 115 may transfer the other data to the buffer 135-*b* so that it can be transferred to the non-volatile memory 125 for storage. Such a process may be referred to as "eviction" and the data transferred from the volatile memory 120 to the buffer 135-*b* may be referred to as "victim" data. In some cases, the interface controller 115 may transfer a subset of the victim data from the buffer 135-*b* to the non-volatile memory 125. For example, the interface controller 115 may transfer one or more subsets of victim data that have changed since the data was initially stored in the non-volatile memory 125. Data that is inconsistent between the volatile memory 120 and the non-volatile memory 125 (e.g., due to an update in one memory and not the other) may be referred to in some cases as "modified" or "dirty" data. In some examples (e.g., when interface controller operates in one mode such as a write-back mode), dirty data may be data that is present in the volatile memory 120 but not present in the non-volatile memory 125.

To perform respective operations, each device in the system 100 may generate various voltages for internal use. For example, the interface controller 115 (or the non-volatile memory 125, among other components) may include a component or circuitry that generates one or more voltages for use by other components in the interface controller 115 (or the non-volatile memory 125, among other components). According to the techniques described herein, capacitors in the volatile memory 120 may be used to regulate voltages generated by the interface controller 115 or the non-volatile memory 125 or both. To enable such a scheme, one or more conductive lines may connect the capacitors in the volatile memory 120 to the components that generate the voltage for regulation.

Figure 2:
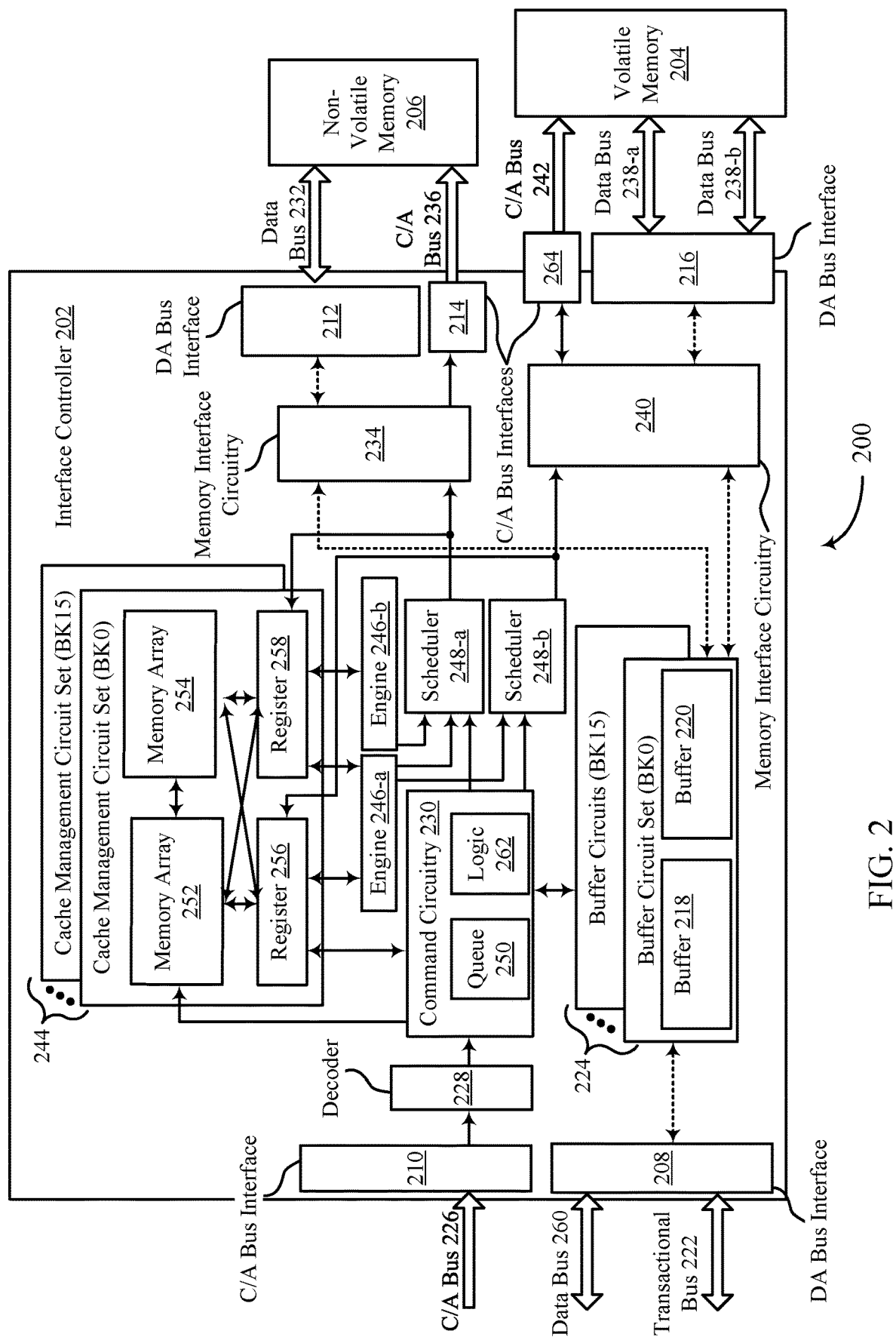
FIG. 2 illustrates an example of a memory subsystem that supports die voltage regulation in accordance with examples as disclosed herein.

FIG. 2 illustrates an example of a memory subsystem 200 that supports die voltage regulation in accordance with examples as disclosed herein. The memory subsystem 200 may be an example of the memory subsystem 110 described with reference to FIG. 1. Accordingly, the memory subsystem 200 may interact with a host device as described with reference to FIG. 1. The memory subsystem 200 may include an interface controller 202, a volatile memory 204, and a non-volatile memory 206, which may be examples of the interface controller 115, the volatile memory 120, and the non-volatile memory 125, respectively, as described with reference to FIG. 1. Thus, the interface controller 202 may interface with the volatile memory 204 and the non-volatile memory 206 on behalf of the host device as described with reference to FIG. 1. For example, the interface controller 202 may operate the volatile memory 204 as a cache for the non-volatile memory 206. Operating the volatile memory 204 as the cache may allow subsystem to provide the benefits of the non-volatile memory 206 (e.g., non-volatile, high-density storage) while maintaining compatibility with a host device that supports a different protocol than the non-volatile memory 206.

In FIG. 2, dashed lines between components represent the flow of data or communication paths for data and solid lines between components represent the flow of commands or communication paths for commands. In some cases, the memory subsystem 200 is one of multiple similar or identical subsystems that may be included in an electronic device. Each subsystem may be referred to as a slice and may be associated with a respective channel of a host device in some examples.

The non-volatile memory 206 may be configured to operate as a main memory (e.g., memory for long-term data storage) for a host device. In some cases, the non-volatile memory 206 may include one or more arrays of FeRAM cells. Each FeRAM cell may include a selection component and a ferroelectric capacitor, and may be accessed by applying appropriate voltages to one or more access lines such as word lines, plates lines, and digit lines. In some examples, a subset of FeRAM cells coupled with to an activated word line may be sensed, for example concurrently or simultaneously, without having to sense all FeRAM cells coupled with the activated word line. Accordingly, a page size for an FeRAM array may be different than (e.g., smaller than) a DRAM page size. In the context of a memory device, a page may refer to the memory cells in a row (e.g., a group of the memory cells that have a common row address) and a page size may refer to the number of memory cells or column addresses in a row, or the number of column addresses accessed during an access operation. Alternatively, a page size may refer to a size of data handled by various interfaces. In some cases, different memory device types may have different page sizes. For example, a DRAM page size (e.g., 2 kB) may be a superset of a non-volatile memory (e.g., FeRAM) page size (e.g., 64B).

A smaller page size of an FeRAM array may provide various efficiency benefits, as an individual FeRAM cell may require more power to read or write than an individual DRAM cell. For example, a smaller page size for an FeRAM array may facilitate effective energy usage because a smaller number of FeRAM cells may be activated when an associated change in information is minor. In some examples, the page size for an array of FeRAM cells may vary, for example dynamically (e.g., during operation of the array of FeRAM cells) depending on the nature of data and command utilizing FeRAM operation.

Although an individual FeRAM cell may require more power to read or write than an individual DRAM cell, an FeRAM cell may maintain its stored logic state for an extended period of time in the absence of an external power source, as the ferroelectric material in the FeRAM cell may maintain a non-zero electric polarization in the absence of an electric field. Therefore, including an FeRAM array in the non-volatile memory 206 may provide efficiency benefits relative to volatile memory cells (e.g., DRAM cells in the volatile memory 204), as it may reduce or eliminate requirements to perform refresh operations.

The volatile memory 204 may be configured to operate as a cache for the non-volatile memory 206. In some cases, the volatile memory 204 may include one or more arrays of DRAM cells. Each DRAM cell may include a capacitor that includes a dielectric material to store a charge representative of the programmable state. The memory cells of the volatile memory 204 may be logically grouped or arranged into one or more memory banks (as referred to herein as "banks"). For example, volatile memory 204 may include sixteen banks. The memory cells of a bank may be arranged in a grid or an array of intersecting columns and rows and each memory cell may be accessed or refreshed by applying appropriate voltages to the digit line (e.g., column line) and word line (e.g., row line) for that memory cell. The rows of a bank may be referred to pages, and the page size may refer to the number of columns or memory cells in a row. As noted, the page size of the volatile memory 204 may be different than (e.g., larger than) the page size of the non-volatile memory 206.

The interface controller 202 may include various circuits for interfacing (e.g., communicating) with other devices, such as a host device, the volatile memory 204, and the non-volatile memory 206. For example, the interface controller 202 may include a data (DA) bus interface 208, a command and address (C/A) bus interface 210, a data bus interface 212, a C/A bus interface 214, a data bus interface 216, and a C/A bus interface 264. The data bus interfaces may support the communication of information using one or more communication protocols. For example, the data bus interface 208, the C/A bus interface 210, the data bus interface 216, and the C/A bus interface 264 may support information that is communicated using a first protocol (e.g., LPDDR signaling), whereas the data bus interface 212 and the C/A bus interface 214 may support information communicated using a second protocol. Thus, the various bus interfaces coupled with the interface controller 202 may support different amounts of data or data rates.

The data bus interface 208 may be coupled with the data bus 260, the transactional bus 222, and the buffer circuitry 224. The data bus interface 208 may be configured to transmit and receive data over the data bus 260 and control information (e.g., acknowledgements/negative acknowledgements) or metadata over the transactional bus 222. The data bus interface 208 may also be configured to transfer data between the data bus 260 and the buffer circuitry 224. The data bus 260 and the transactional bus 222 may be coupled with the interface controller 202 and the host device such that a conductive path is established between the interface controller 202 and the host device. In some examples, the pins of the transactional bus 222 may be referred to as data mask inversion (DMI) pins. Although shown with one data bus 260 and one transactional bus 222, there may be any number of data buses 260 and any number of transactional buses 222 coupled with one or more data bus interfaces 208.

The C/A bus interface 210 may be coupled with the C/A bus 226 and the decoder 228. The C/A bus interface 210 may be configured to transmit and receive commands and addresses over the C/A bus 226. The commands and addresses received over the C/A bus 226 may be associated with data received or transmitted over the data bus 260. The C/A bus interface 210 may also be configured to transmit commands and addresses to the decoder 228 so that the decoder 228 can decode the commands and relay the decoded commands and associated addresses to the command circuitry 230.

The data bus interface 212 may be coupled with the data bus 232 and the memory interface circuitry 234. The data bus interface 212 may be configured to transmit and receive data over the data bus 232, which may be coupled with the non-volatile memory 206. The data bus interface 212 may also be configured to transfer data between the data bus 232 and the memory interface circuitry 234. The C/A bus interface 214 may be coupled with the C/A bus 236 and the memory interface circuitry 234. The C/A bus interface 214 may be configured to receive commands and addresses from the memory interface circuitry 234 and relay the commands and the addresses to the non-volatile memory 206 (e.g., to a local controller of the non-volatile memory 206) over the C/A bus 236. The commands and the addresses transmitted over the C/A bus 236 may be associated with data received or transmitted over the data bus 232. The data bus 232 and the C/A bus 236 may be coupled with the interface controller 202 and the non-volatile memory 206 such that conductive paths are established between the interface controller 202 and the non-volatile memory 206.

The data bus interface 216 may be coupled with the data buses 238 and the memory interface circuitry 240. The data bus interface 216 may be configured to transmit and receive data over the data buses 238, which may be coupled with the volatile memory 204. The data bus interface 216 may also be configured to transfer data between the data buses 238 and the memory interface circuitry 240. The C/A bus interface 264 may be coupled with the C/A bus 242 and the memory interface circuitry 240. The C/A bus interface 264 may be configured to receive commands and addresses from the memory interface circuitry 240 and relay the commands and the addresses to the volatile memory 204 (e.g., to a local controller of the volatile memory 204) over the C/A bus 242. The commands and addresses transmitted over the C/A bus 242 may be associated with data received or transmitted over the data buses 238. The data bus 238 and the C/A bus 242 may be coupled with the interface controller 202 and the volatile memory 204 such that conductive paths are established between the interface controller 202 and the volatile memory 204.

In addition to buses and bus interfaces for communicating with coupled devices, the interface controller 202 may include circuitry for operating the non-volatile memory 206 as a main memory and the volatile memory 204 as a cache. For example, the interface controller 202 may include command circuitry 230, buffer circuitry 224, cache management circuitry 244, one or more engines 246, and one or more schedulers 248.

The command circuitry 230 may be coupled with the buffer circuitry 224, the decoder 228, the cache management circuitry 244, and the schedulers 248, among other components. The command circuitry 230 may be configured to receive command and address information from the decoder 228 and store the command and address information in the queue 250. The command circuitry 230 may include logic 262 that processes command information (e.g., from a host device) and storage information from other components (e.g., the cache management circuitry 244, the buffer circuitry 224) and uses that information to generate one or more commands for the schedulers 248. The command circuitry 230 may also be configured to transfer address information (e.g., address bits) to the cache management circuitry 244. In some examples, the logic 26 2522 may be a circuit configured to operate as a finite state machine (FSM).

The buffer circuitry 224 may be coupled with the data bus interface 208, the command circuitry 230, the memory interface circuitry 234, and the memory interface circuitry 234. The buffer circuitry 224 may include a set of one or more buffer circuits for at least some banks, if not each bank, of the volatile memory 204. The buffer circuitry 224 may also include components (e.g., a memory controller) for accessing the buffer circuits. In one example, the volatile memory 204 may include sixteen banks and the buffer circuitry 224 may include sixteen sets of buffer circuits. Each set of the buffer circuits may be configured to store data from or for (or both) a respective bank of the volatile memory 204. As an example, the buffer circuit set for bank 0 (BK0) may be configured to store data from or for (or both) the first bank of the volatile memory 204 and the buffer circuit for bank 15 (BK15) may be configured to store data from or for (or both) the sixteenth bank of the volatile memory 204.

Each set of buffer circuits in the buffer circuitry 224 may include a pair of buffers. The pair of buffers may include one buffer (e.g., an open page data (OPD) buffer) configured to store data targeted by an access command (e.g., a storage command or retrieval command) from the host device and another buffer (e.g., a victim page data (VPD) buffer) configured to store data for an eviction process that results from the access command. For example, the buffer circuit set for BK0 may include the buffer 218 and the buffer 220, which may be examples of buffer 135-*a* and 135-*b*, respectively. The buffer 218 may be configured to store BK0 data that is targeted by an access command from the host device. And the buffer 220 may be configured to store data that is transferred from BK0 as part of an eviction process triggered by the access command. Each buffer in a buffer circuit set may be configured with a size (e.g., storage capacity) that corresponds to a page size of the volatile memory 204. For example, if the page size of the volatile memory 204 is 2 kB, the size of each buffer may be 2 kB. Thus, the size of the buffer may be equivalent to the page size of the volatile memory 204 in some examples.

The cache management circuitry 244 may be coupled with the command circuitry 230, the engines 246, and the schedulers 248, among other components. The cache management circuitry 244 may include a cache management circuit set for one or more banks (e.g., each bank) of volatile memory. As an example, the cache management circuitry 244 may include sixteen cache management circuit sets for BK0 through BK15. Each cache management circuit set may include two memory arrays that may be configured to store storage information for the volatile memory 204. As an example, the cache management circuit set for BK0 may include a memory array 252 (e.g., a CDRAM Tag Array (CDT-TA)) and a memory array 254 (e.g., a CDRAM Valid (CDT-V) array), which may be configured to store storage information for BK0. The memory arrays may also be referred to as arrays or buffers in some examples. In some cases, the memory arrays may be or include volatile memory cells, such as SRAM cells.

Storage information may include content information, validity information, or dirty information (or any combination thereof) associated with the volatile memory 204. Content information (which may also be referred to as tag information or address information) may indicate which data is stored in a set of volatile memory cells. For example, the content information (e.g., a tag address) for a set of one or more volatile memory cells may indicate which set of one or more non-volatile memory cells currently has data stored in the set of one or more volatile memory cells. Validity information may indicate whether the data stored in a set of volatile memory cells is actual data (e.g., data having an intended order or form) or placeholder data (e.g., data being random or dummy, not having an intended or important order). And dirty information may indicate whether the data stored in a set of one or more volatile memory cells of the volatile memory 204 is different than corresponding data stored in a set of one or more non-volatile memory cells of the non-volatile memory 206. For example, dirty information may indicate whether data stored in a set of volatile memory cells has been updated relative to data stored in the non-volatile memory 206.

The memory array 252 may include memory cells that store storage information (e.g., content and validity information) for an associated bank (e.g., BK0) of the volatile memory 204. The storage information may be stored on a per-page basis (e.g., there may be respective storage information for each page of the associated non-volatile memory bank). The interface controller 202 may check for requested data in the volatile memory 204 by referencing the storage information in the memory array 252. For instance, the interface controller 202 may receive, from a host device, a retrieval command for data in a set of non-volatile memory cells in the non-volatile memory 206. The interface controller 202 may use a set of one or more address bits (e.g., a set of row address bits) targeted by the access request to reference the storage information in the memory array 252. For instance, using set-associative mapping, the interface controller 202 may reference the content information in the memory array 252 to determine which set of volatile memory cells, if any, stores the requested data.

In addition to storing content information for volatile memory cells, the memory array 252 may also store validity information that indicates whether the data in a set of volatile memory cells is actual data (also referred to as valid data) or random data (also referred to as invalid data). For example, the volatile memory cells in the volatile memory 204 may initially store random data and continue to do so until the volatile memory cells are written with data from a host device or the non-volatile memory 206. To track which data is valid, the memory array 252 may be configured to set a bit for each set of volatile memory cells when actual data is stored in that set of volatile memory cells. This bit may be referred to a validity bit or a validity flag. As with the content information, the validity information stored in the memory array 252 may be stored on a per-page basis. Thus, each validity bit may indicate the validity of data stored in an associated page in some examples.

The memory array 254 may be similar to the memory array 252 and may also include memory cells that store validity information for a bank (e.g., BK0) of the volatile memory 204 that is associated with the memory array 252. However, the validity information stored in the memory array 254 may be stored on a sub-block basis as opposed to a per-page basis for the memory array 252. For example, the validity information stored in the memory cells of the memory array 254 may indicate the validity of data for subsets of volatile memory cells in a set (e.g., page) of volatile memory cells. As an example, the validity information in the memory array 254 may indicate the validity of each subset (e.g., 64B) of data in a page of data stored in BK0 of the volatile memory 204. Storing content information and validity information on a per-page basis in the memory array 252 may allow the interface controller 202 to quickly and efficiently determine whether there is a hit or miss for data in the volatile memory 204. Storing validity information on a sub-block basis may allow the interface controller 202 to determine which subsets of data to preserve in the non-volatile memory 206 during an eviction process.

Each cache management circuit set may also include a respective pair of registers coupled with the command circuitry 230, the engines 246, the memory interface circuitry 234, the memory interface circuitry 240, and the memory arrays for that cache management circuit set, among other components. For example, a cache management circuit set may include a first register (e.g., a register 256 which may be an open page tag (OPT) register) configured to receive storage information (e.g., one or more bits of tag information, validity information, or dirty information) from the memory array 252 or the scheduler 248-$b$ or both. The cache management circuitry set may also include a second register (e.g., a register 258 which may be a victim page tag (VPT) register) configured to receive storage information from the memory array 254 and the scheduler 248-$a$ or both. The information in the register 256 and the register 258 may be transferred to the command circuitry 230 and the engines 246 to enable decision-making by these components. For example, the command circuitry 230 may issue commands for reading the non-volatile memory 206 or the volatile memory 204 based on content information from the register 256.

The engine 246-$a$ may be coupled with the register 256, the register 258, and the schedulers 248. The engine 246-$a$ may be configured to receive storage information from various components and issue commands to the schedulers 248 based on the storage information. For example, when the interface controller 202 is in a first mode such as a write-through mode, the engine 246-$a$ may issue commands to the scheduler 248-$b$ and in response the scheduler 248-$b$ to initiate or facilitate the transfer of data from the buffer 218 to both the volatile memory 204 and the non-volatile memory 206. Alternatively, when the interface controller 202 is in a second mode such as a write-back mode, the engine 246-$a$ may issue commands to the scheduler 248-$b$ and in response the scheduler 248-*b* may initiate or facilitate the transfer of data from the buffer 218 to the volatile memory 204. In the event of a write-back operation, the data stored in the volatile memory 204 may eventually be transferred to the non-volatile memory 206 during a subsequent eviction process.

The engine 246-*b* may be coupled with the register 258 and the scheduler 248-*a*. The engine 246-*b* may be configured to receive storage information from the register 258 and issue commands to the scheduler 248-*a* based on the storage information. For instance, the engine 246-*b* may issue commands to the scheduler 248-*a* to initiate or facilitate transfer of dirty data from the buffer 220 to the non-volatile memory 206 (e.g., as part of an eviction process). If the buffer 220 holds a set of data transferred from the volatile memory 204 (e.g., victim data), the engine 246-*b* may indicate which one or more subsets (e.g., which 64B) of the set of data in the buffer 220 should be transferred to the non-volatile memory 206.

The scheduler 248-*a* may be coupled with various components of the interface controller 202 and may facilitate accessing the non-volatile memory 206 by issuing commands to the memory interface circuitry 234. The commands issued by the scheduler 248-*a* may be based on commands from the command circuitry 230, the engine 246-*a*, the engine 246-*b*, or a combination of these components. Similarly, the scheduler 248-*b* may be coupled with various components of the interface controller 202 and may facilitate accessing the volatile memory 204 by issuing commands to the memory interface circuitry 240. The commands issued by the scheduler 248-*b* may be based on commands from the command circuitry 230 or the engine 246-*a*, or both.

The memory interface circuitry 234 may communicate with the non-volatile memory 206 via one or more of the data bus interface 212 and the C/A bus interface 214. For example, the memory interface circuitry 234 may prompt the C/A bus interface 214 to relay commands issued by the memory interface circuitry 234 over the C/A bus 236 to a local controller in the non-volatile memory 206. And the memory interface circuitry 234 may transmit to, or receive data from, the non-volatile memory 206 over the data bus 232. In some examples, the commands issued by the memory interface circuitry 234 may be supported by the non-volatile memory 206 but not the volatile memory 204 (e.g., the commands issued by the memory interface circuitry 234 may be different than the commands issued by the memory interface circuitry 240).

The memory interface circuitry 240 may communicate with the volatile memory 204 via one or more of the data bus interface 216 and the C/A bus interface 264. For example, the memory interface circuitry 240 may prompt the C/A bus interface 264 to relay commands issued by the memory interface circuitry 240 over the C/A bus 242 to a local controller of the volatile memory 204. And the memory interface circuitry 240 may transmit to, or receive data from, the volatile memory 204 over one or more data buses 238. In some examples, the commands issued by the memory interface circuitry 240 may be supported by the volatile memory 204 but not the non-volatile memory 206 (e.g., the commands issued by the memory interface circuitry 240 may be different than the commands issued by the memory interface circuitry 234).

Together, the components of the interface controller 202 may operate the non-volatile memory 206 as a main memory and the volatile memory 204 as a cache. Such operation may be prompted by one or more access commands (e.g., read/retrieval commands/requests and write/storage commands/requests) received from a host device.

In some examples, the interface controller 202 may receive a storage command from the host device. The storage command may be received over the C/A bus 226 and transferred to the command circuitry 230 via one or more of the C/A bus interface 210 and the decoder 228. The storage command may include or be accompanied by address bits that target a memory address of the non-volatile memory 206. The data to be stored may be received over the data bus 260 and transferred to the buffer 218 via the data bus interface 208. In a write-through mode, the interface controller 202 may transfer the data to both the non-volatile memory 206 and the volatile memory 204. In a write-back mode, the interface controller 202 may transfer the data to only the volatile memory 204. In either mode, the interface controller 202 may first check to see if the volatile memory 204 has memory cells available to store the data. To do so, the command circuitry 230 may reference the memory array 252 (e.g., using a set of the memory address bits) to determine whether one or more of the n sets (e.g., pages) of volatile memory cells associated with the memory address are empty (e.g., store random or invalid data). In some cases, a set of volatile memory cells in the volatile memory 204 may be referred to as a line or cache line.

If one of the n associated sets of volatile memory cells is available for storing information, the interface controller 202 may transfer the data from the buffer 218 to the volatile memory 204 for storage in that set of volatile memory cells. But if no associated sets of volatile memory cells are empty, the interface controller 202 may initiate an eviction process to make room for the data in the volatile memory 204. The eviction process may involve transferring the old data (e.g., existing data) in one of the n associated sets of volatile memory cells to the buffer 220. The dirty information for the old data may also be transferred to the memory array 254 or register 258 for identification of dirty subsets of the old data. After the old data is stored in the buffer 220, the new data can be transferred from the buffer 218 to the volatile memory 204 and the old data can be transferred from the buffer 220 to the non-volatile memory 206. In some cases, dirty subsets of the old data are transferred to the non-volatile memory 206 and clean subsets (e.g., unmodified subsets) are discarded. The dirty subsets may be identified by the engine 246-*b* based on dirty information transferred (e.g., from the volatile memory 204) to the memory array 254 or register 258 during the eviction process.

In another example, the interface controller 202 may receive a retrieval command from the host device. The retrieval command may be received over the C/A bus 226 and transferred to the command circuitry 230 via one or more of the C/A bus interface 210 and the decoder 228. The retrieval command may include address bits that target a memory address of the non-volatile memory 206. Before attempting to access the targeted memory address of the non-volatile memory 206, the interface controller 202 may check to see if the volatile memory 204 stores the data. To do so, the command circuitry 230 may reference the memory array 252 (e.g., using a set of the memory address bits) to determine whether one or more of the n sets of volatile memory cells associated with the memory address stores the requested data. If the requested data is stored in the volatile memory 204, the interface controller 202 may transfer the requested data to the buffer 218 for transmission to the host device over the data bus 260.

If the requested data is not stored in the volatile memory 204, the interface controller 202 may retrieve the data from the non-volatile memory 206 and transfer the data to the buffer 218 for transmission to the host device over the data bus 260. Additionally, the interface controller 202 may transfer the requested data from the buffer 218 to the volatile memory 204 so that the data can be accessed with a lower latency during a subsequent retrieval operation. Before transferring the requested data, however, the interface controller 202 may first determine whether one or more of the n associated sets of volatile memory cells are available to store the requested data. The interface controller 202 may determine the availability of the n associated sets of volatile memory cells by communicating with the related cache management circuit set. If an associated set of volatile memory cells is available, the interface controller 202 may transfer the data in the buffer 218 to the volatile memory 204 without performing an eviction process. Otherwise, the interface controller 202 may transfer the data from the buffer 218 to the volatile memory 204 after performing an eviction process.

The memory subsystem 200 may be implemented in one or more configurations, including one-chip versions and multi-chip versions. A multi-chip version may include one or more constituents of the memory subsystem 200, including the interface controller 202, the volatile memory 204, and the non-volatile memory 206 (among other constituents or combinations of constituents), on a chip that is separate from a chip that includes one or more other constituents of the memory subsystem 200. For example, in one multi-chip version, respective separate chips may include each of the interface controller 202, the volatile memory 204, and the non-volatile memory 206. In contrast, a one-chip version may include the interface controller 202, the volatile memory 204, and the non-volatile memory 206 on a single chip. A chip may also be referred to herein as a die.

In some examples, the interface controller 115, the volatile memory 120, and the non-volatile memory 125 may be disposed on separate dies, and each die may include one or more components that produce voltage for use by one or more other components on that die. The voltage produced by a component may be regulated using a capacitor to reduce deviations from a threshold of an operation range. But using internal capacitors (with respect to the die) to regulate the voltage may be impractical for cost and space reasons. And using a discrete, stand-alone external capacitor may negatively impact packaging dimensions due to the size of the capacitor.

According to the techniques described herein, the voltage produced by a component on a first die (e.g., a die that includes the interface controller 115 or the non-volatile memory 125) may be regulated by a capacitor on a second die (e.g., a die that includes the volatile memory 120). The capacitor on the second die may, in some examples, be formed using the same process as the capacitors that function as memory cells on the second die, and thus may be cost-efficient and space-efficient relative to alternatives, such as a capacitor internal to the first die or a discrete, stand-alone external capacitor. To enable voltage regulation, the one or more components that generate one or more voltages to be regulated may be coupled with the capacitor on the second die via one or more conductive lines.

Figure 3:
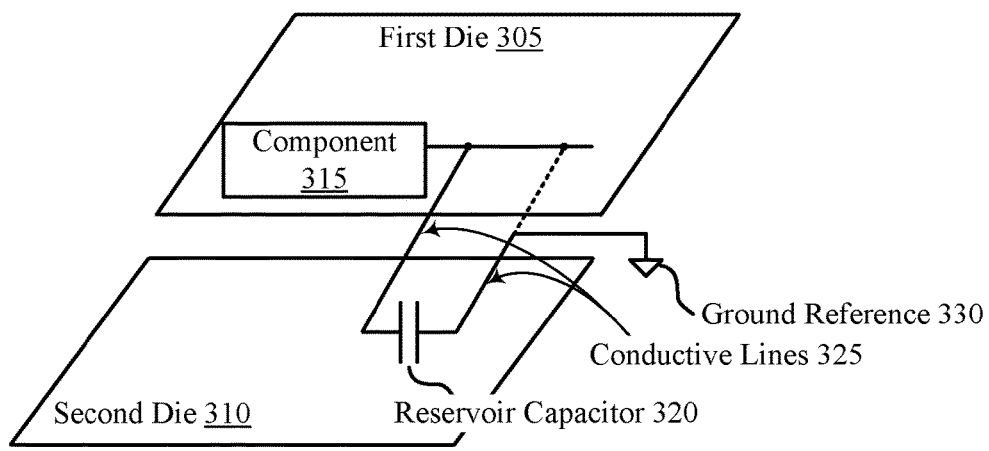
FIG. 3 illustrates an example of dice that support die voltage regulation in accordance with examples as disclosed herein.

FIG. 3 illustrates an example of dice 300 that support die voltage regulation in accordance with examples as disclosed herein. The dice 300 may include a first die 305 and a second die 310. The first die 305 may be an example of a logic die that includes the interface controller 115 or a memory die that includes the non-volatile memory 125 as described with reference to FIG. 1. Or the first die 305 may be an example of a logic die that includes the interface controller 202 or a memory die that includes the non-volatile memory 206 as described with reference to FIG. 2. The second die 310 may be an example of a memory die that includes the volatile memory 120 as described with reference to FIG. 1. Or the second die 310 may be an example of a memory die that includes the volatile memory 204 as described with reference to FIG. 2. In some examples, the second memory die is a DRAM die (e.g., a die that includes DRAM cells).

The first die 305 may include at least one component 315 that outputs voltage. In some cases, the component 315 may be a component that generates voltage for use by, or the operation of, the first die 305. For example, the component 315 may be a voltage source, voltage pump, low-dropout (LDO) voltage regulator, input/output (I/O) component, or other component, among other examples, that outputs a voltage for use by one or more other components of the first die 305. Additionally or alternatively, the component 315 may supply power to the second die 310 (e.g., the second die 310 may use voltage output by the component 315 for one or more operations). In some examples, the voltage output by the component 315 may experience fluctuations that are disruptive or that make the voltage unsuitable for use by other components. For instance, rather than remain a constant level (or a level within an operating range), the voltage produced by the component 315 may peak and dive in a ripple-like manner. Such potential variation in the voltage may negatively impact the operation of components to which the voltage is applied.

In some examples, the voltage generated by the component 315 may be regulated (e.g., smoothed, maintained within a range of a threshold) by coupling the component 315 with a capacitive load. For instance, the output of the component 315 may be coupled with a "reservoir" or "smoothing" capacitor that dampens the voltage when it rises above a threshold and that boosts the voltage when it drops below a threshold. In one example, the reservoir capacitor 320 may be placed in parallel with the output of the component 315 so that the capacitor 1) charges when the voltage of the output rises above that of the capacitor and 2) discharges when the voltage of the output falls below that of the capacitor, among other examples. Accordingly, the reservoir capacitor 320 may provide current to the output of the component 315 when the voltage of the component 315 is below a threshold voltage and may sink current when the voltage of the component 315 rises above a threshold voltage. Thus, the capacitor may maintain the voltage output by the component 315 within a threshold range.

However, including such a capacitor on the first die 305 may require space on the first die 305 and be cost-prohibitive, among other drawbacks. And using a discrete external capacitor may increase the size of the package that houses the first die 305 and the second die 310, among other potential disadvantages. For example, the height of the package may be much higher than it would be otherwise to accommodate the height of the capacitor. Because the height of a reservoir capacitor may be a function of the magnitude (e.g., amplitude) of the voltage to be regulated, increasing the voltage generated by the component 315 may result in taller reservoir capacitor, which in turn may increase the dimension of a physical package containing the reservoir capacitor and/or the first die 305.

According to the techniques described herein, a capacitor on the second die 310 may be used to regulate the voltage output by a component of the first die 305. For example, the reservoir capacitor 320 on the second die 310 may regulate a voltage generated by the component 315 on the first die 305. The voltage regulation may be enabled by the conductive lines 325, which may couple the reservoir capacitor 320 with the component 315. For example, one conductive line 325 may couple a first terminal of the reservoir capacitor 320 with a first output terminal of the component 315 and another conductive line 325 may couple a second terminal of the reservoir capacitor 320 with a ground reference 330 (and/or a second output terminal of the component 315). Compared to a discrete external capacitor, the reservoir capacitor 320 may be relatively area-efficient, low-cost, and thin, among other advantages. For example, the reservoir capacitor 320 may be constructed via a custom low-cost process used to construct the capacitors of DRAM memory cells, which may be more compact than discrete capacitors. Thus, in line with the present disclosure, the benefits of an external reservoir capacitor may be realized without sacrificing packaging dimensions.

Although similar in structure to capacitors that operate as memory cells on the second die 310, the reservoir capacitor 320 may be isolated from one or more of these other capacitors to, among other advantages, prevent damage that might otherwise occur due to voltage differences between the dice 300. For example, the reservoir capacitor 320 may be physically isolated or electrically isolated (or both) from memory cells and the conductive lines (e.g., digit lines, plate lines, etc.) or from circuitry (e.g., sense components) used to access the memory cells on the second die 310. For example, each terminal of the reservoir capacitor 320 may be directly coupled to a respective conductive line 325 that extends from the terminal to a respective bondpad of the second die. In some examples, the conductive lines 325 extend directly from the terminals of the reservoir capacitor 320 to the bondpads without conductively coupling to other devices (e.g., active devices such as transistors, switching components). In other examples, one or more switching devices may be disposed between the terminals of two reservoir capacitors to enable the effective capacitance of the capacitors to be adjusted. The switching components may be part of an anti-fuse device. In some examples, the bondpad coupled with the reservoir capacitor 320 may be coupled with an electrostatic protection device (e.g., an electrostatic-sensitive device (ESD) protection structure). Thus, in some examples, the reservoir capacitor 320 may be coupled with (but separate from) an electrostatic protection device.

Regardless of isolation, the reservoir capacitor 320 may regulate voltage generated by the component 315 as described herein. Thus, voltage regulation for a first die (e.g., the first die 305) may be achieved or performed by a capacitor (e.g., the reservoir capacitor 320) on a second die (e.g., the second die 310).

Figure 4:
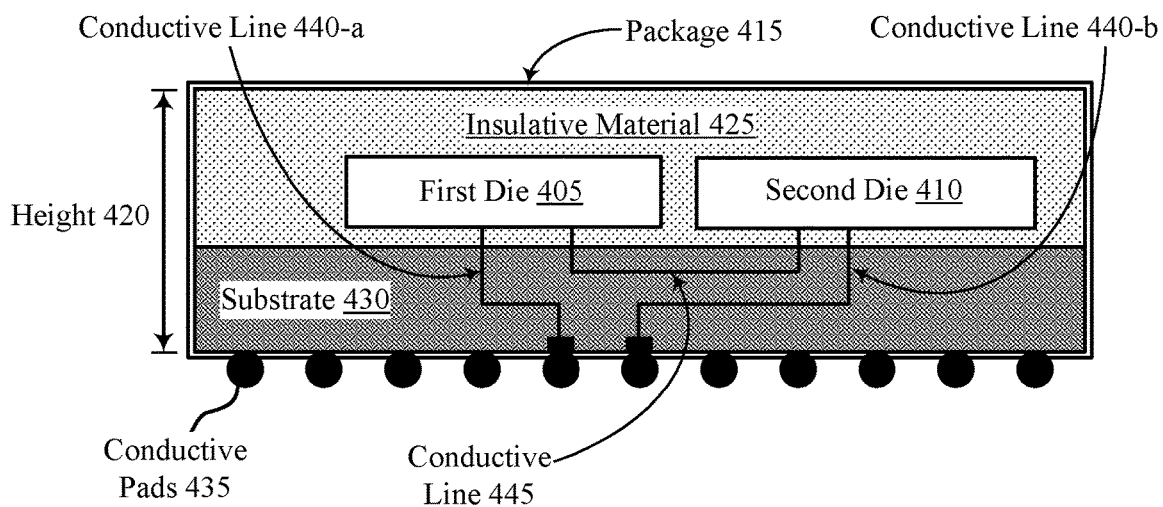
FIG. 4 illustrates an example of a device that supports die voltage regulation in accordance with examples as disclosed herein.
Figure 4:
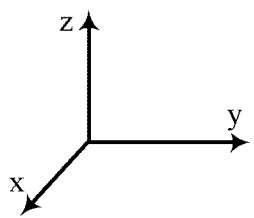

FIG. 4 illustrates an example of a device 400 that supports die voltage regulation in accordance with examples as disclosed herein. The device 400 may include a first die 405 and a second die 410. The first die 405 may be an example of a logic die that includes the interface controller 115 as described with reference to FIG. 1, a memory die that includes the non-volatile memory 125 as described with reference to FIG. 1, a logic die that includes the interface controller 202 as described with reference to FIG. 2, a memory die that includes the non-volatile memory 206 as described with reference to FIG. 2, or the first die 305 as described with reference to FIG. 3. The second die 410 may be an example of a memory die that includes the volatile memory 120 as described with reference to FIG. 1, a memory die that includes the volatile memory 204 as described with reference to FIG. 2, or the second die 310 as described with reference to FIG. 3. In some examples, the second die 410 is a DRAM die (e.g., a die that includes DRAM cells).

The first die 405 and the second die 410 may be included in a physical package such as package 415, which may include a plastic or otherwise non-conductive (e.g., insulative) material. The package 415 may have height 420 that is a function of the size of the components contained in the package 415. Inside the package 415, the first die 405 and the second die 410 may be held in place by a material, such as an insulative material 425, that at least partially surrounds the first die 405 and the second die 410. The insulative material 425 may be in contact with (e.g., disposed on) the substrate 430. The substrate 430 may be coupled with the conductive pads 435 (also referred to as conductive interfaces, ball-outs, pins, bondpads, etc.), which in turn may be coupled with another device, such as a host device as described with reference to FIG. 1. Thus, the device 400 may communicate with another device, such as a host device, by sending electronic signals over the conductive pads.

The first die 405 and the second die 410 may each be coupled with one or more conductive lines that allow electrical signals to be sent from the dies to other devices (e.g., through conductive pads 435). A conductive line may also be referred to as a trace, route, channel, bus line, or other suitable terminology. As an example, the first die 405 may be coupled with a conductive line 440-*a* and the second die 410 may be coupled with a conductive line 440-*b*. The conductive line 440-*a* may allow the first die 405 to transmit electrical signals (e.g., commands, addresses, data, etc.) to devices outside the package 415 and the conductive line 440-*b* may allow the second die 410 to transmit electrical signals to devices outside the package 415. Although shown coupled with one conductive line 440 each, the dies may be coupled with any number of conductive lines 440 in various configurations.

The first die 405 and the second die 410 may also be coupled with a conductive line 445, which may allow a capacitor on the second die 410 to regulate voltage output by a component on the first die 405. For example, the conductive line 445 may connect a component on the first die 405 (e.g., a component configured to generate voltage, such as the component 315) with a capacitor on the second die 410 (e.g., a reservoir capacitor such as the reservoir capacitor 320). For ease of illustration a single conductive line 445 is shown, but the conductive line 445 may be one of multiple conductive lines that connect a reservoir capacitor as shown in FIG. 3. In some examples, an output terminal of the component 315 may share the same node (e.g., conductive pad 435) as one of the conductive lines 445 and/or one of the terminals of the reservoir capacitor 320. In some examples, a conductive line 445 or a conductive line 440-*b* may couple the other terminal of the reservoir capacitor to a ground pin (e.g., a ground conductive pad 435).

The conductive line 445 may pass through (e.g., be disposed through) the insulative material 425 in a first direction (e.g., in the z-direction) and may pass through (e.g., be disposed through) the substrate 430 in a second direction (e.g., the y-direction). Thus, the conductive line 445 may pass through the substrate in a plane (e.g., the x-y plane) that is perpendicular to the first direction (e.g., the z-direction). In some cases, the portion or section of a conductive line that passes through the substrate 430 may be referred to as a transverse portion or transverse section because it extends across the substrate 430 in the x-y plane. In some examples, the transverse portion of the conductive line 445 may be below (with respect to the z-direction) the first die 405 and the second die 410 and above the transverse portions of the conductive lines 440.

As shown, the techniques described herein be implemented (e.g., in Universal Flash Storage (UFS) applications, managed NAND (mNAND) applications, UFS-based multichip package (uMCP) applications) as an in-package solution in which the second die 410 is included in the same package as the first die 405. However, the techniques described here may also be implemented (e.g., in solid-state drive (SSD) applications) as an on-board solution in which the first die 405 and the second die 410 are included in the same electronic device but housed in different packages. Regardless of the packaging scheme, regulating voltage generated by the first die 405 using a capacitor on the second die 410 may provide various advantages (e.g., lower formation cost, reduced package height) compared to other voltage regulation schemes.

Figure 5:
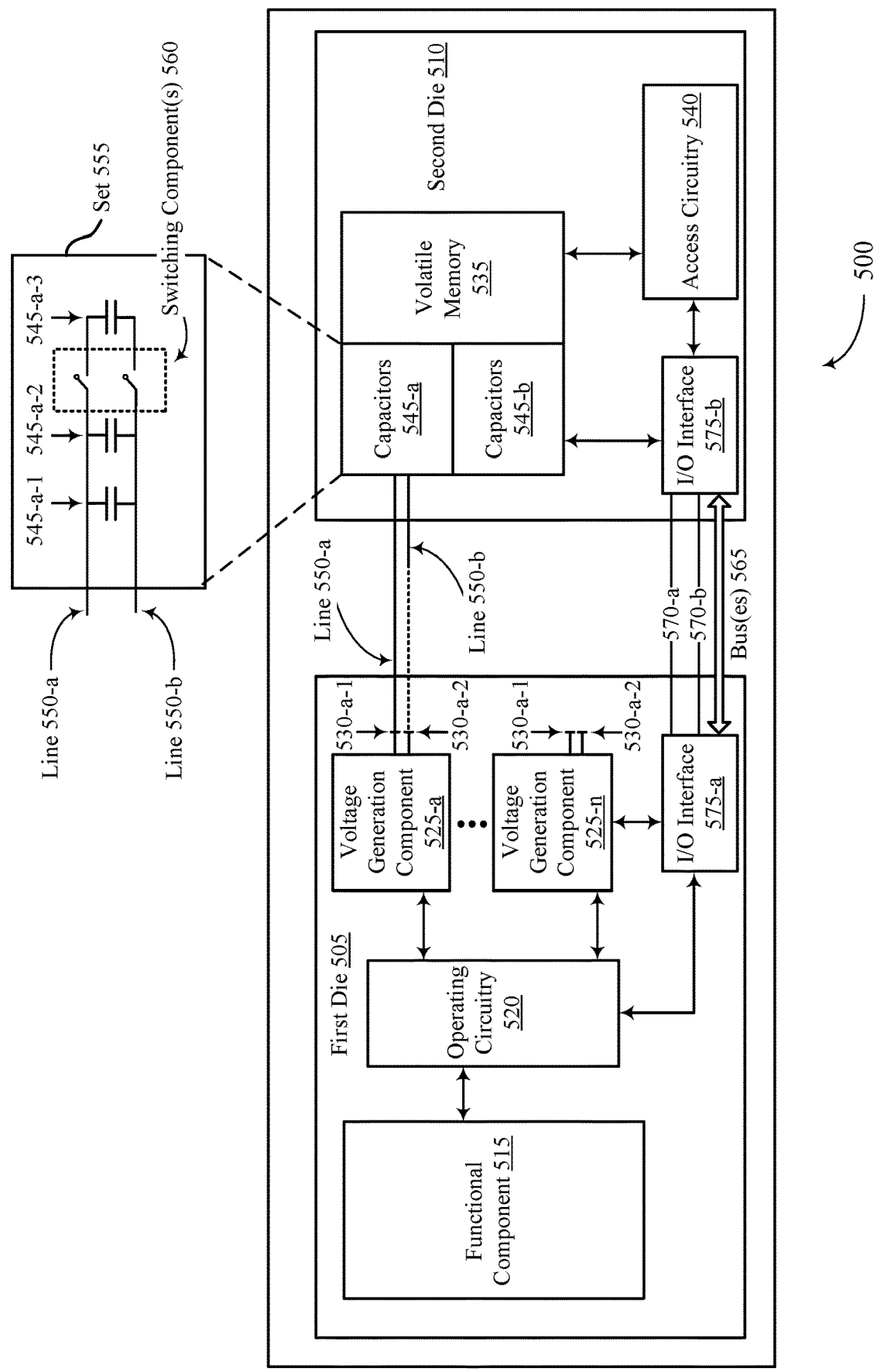
FIG. 5 illustrates an example of a device that supports die voltage regulation in accordance with examples as disclosed herein.

FIG. 5 illustrates an example of a device 500 that supports die voltage regulation in accordance with examples as disclosed herein. The device 500 may be an example of the device 400 as described with reference to FIG. 4 and may include a first die 505 and a second die 510. The first die 505 may be an example of the first die 305 as described with reference to FIG. 3 or the first die 405 as described with reference to FIG. 4. The second die 510 may be an example of the second die 310 as described with reference to FIG. 3 or the second die 410 as described with reference to FIG. 4. Unless otherwise described, arrow-terminated lines in FIG. 5 may represent communication paths for information such as data, metadata, commands, addresses, and so on. Lines without arrow termination may represent conductive lines (e.g., metal traces) that connect components.

The first die 505 may include a functional component 515, which may be a non-volatile memory array or a logic chip, among other examples. For example, the functional component 515 may be an FeRAM array when the first die 505 is an example of the non-volatile memory 106 as described with reference to FIG. 1. The first die 505 may also include operating circuitry 520, which may include circuitry for interfacing with and accessing the functional component 515 or other components of the first die 505. The operating circuitry 520 may use one or more voltages which may be provided by one or more voltage generating components, such as voltage generation component 525-*a* through voltage generation component 525-*n*. The voltage generation components 525 may be examples of voltage sources, voltage pumps, LDO voltage regulators, I/O components, and the like, and thus may generate and output voltages for use by other components of the first die 505. In some examples, the operating circuitry 520 may include switching components that, when activated, transfer voltage produced by a voltage generation component 525 to other components on the first die 505. Thus, the voltages produced by the voltage generation components 525 may be applied to one or more other components of the first die 505.

Each voltage generation component 525 may include one or more output terminals 530 that the voltage generation component 525 charges to a predetermined or configurable voltage level. For example, the voltage generation component 525 may include an output terminal 530-*a*-1 and an output terminal 530-*a*-2. Similarly, the voltage generation component 525-*n* may include an output terminal 530-*n*-1 and an output terminal 530-*n*-2. As noted, the voltage produced by a voltage generation component 525 may be applied to another component of the first die 505 by establishing a conductive path (e.g., made up of conductive lines, switching components) between the output terminals 530 and the other component. An output terminal may also be referred to as an output node, output point, or other suitable terminology.

The second die 510 may include a volatile memory 535, which may be an example of the volatile memory 120 or the volatile memory 204 described with reference to FIGS. 1 and 2, respectively. The volatile memory 535 may include one or more arrays of volatile memory cells, which may be DRAM cells. As noted, a DRAM cell may include a capacitor that is configured to store charge representative of a logic state. The volatile memory 535 may be accessed by the access circuitry 540, which may include components that facilitate memory operations such as read operations, write operations, refresh operations, and the like. For example, the access circuitry 540 may include a memory controller, address decoding components (e.g., row decoders and column decoders), sensing components (e.g., sense amplifiers), drivers, or access lines (e.g., digit lines, plate lines, and word lines), or any combination thereof, among other components. Thus, the memory cells in the volatile memory 535 may be coupled (e.g. electrically, physically) with the components of the access circuitry 540.

The second die 510 may also include one or more capacitors 545 that provide voltage regulation for other components of device 500. For instance, the capacitors 545-*a* may regulate voltage generated by the first die 505 and the capacitors 545-*b* may regulate voltage generated by the second die 510. As an example, the capacitors 545-*a* may regulate voltage output by voltage generation components 525. In some examples, the capacitors 545-*a* may be configured to regulate higher voltages than the capacitors 545-*a* (or vice versa). The capacitors 545 may share the same form or structure as the capacitors of the volatile memory cells in the volatile memory 535, but, unlike the memory cell capacitors, the capacitors 545 may be isolated from the access circuitry 540. Also, the capacitors 545-*a* may be isolated from the capacitors 545-*b*. Such isolation may increase the reliability and lifetime of the capacitors 545 (or other components) by preventing exposure to harmful voltages (e.g., voltages exceeding the rating of the capacitors 545 or other components). However, the capacitors 545-*a* may share a common ground reference with the capacitors 545-*b* and the memory cell capacitors.

In some examples, the capacitors 545 may be passive devices (e.g., components that do not require an external power source for operation and/or that are capable of storing energy). In some examples, the capacitors 545 may be components that have two conductive terminals separated by an insulator.

The capacitors 545-*a* may be connected to the voltage generation components 525 by one or more conductive lines 550. For example, the conductive line 550-*a* may connect n of the capacitors 545-*a* to the output terminal 530-*a*-1 and the conductive line 550-*b* may connect the n capacitors 545-*a* to a ground reference (not shown) and/or the output terminal 530-*a*-2 (where n is an integer). The conductive lines 550 be arranged as described in FIGS. 3 and 4. Thus, voltage output by the voltage generation component 525-*a* may be regulated (e.g., maintained within a band of voltage levels) by the set of the capacitors 545-*a*.

In some examples, the connection(s) between a voltage generation component 525 and the capacitors 545-*a* may be fixed (e.g., permanent, static, unchangeable) so that there is no variation in the capacitance provided by the capacitors 545-*a*. For example, the conductive lines 550 may be hard-wired conductive lines that form direct connections between the voltage generation components 525-*a* and the capacitors 545-*a*. A hard-wired feature may be one that is implemented in the form of permanent circuitry. A direct connection may be a connection between two or more components that is uninterrupted by other components, such as switching components. A hard-wired direct connection may also be referred to herein as a "short." Thus, a fixed capacitance may be provided to the voltage generation component 525-*a* by shorting the conductive line 550-*a* and the conductive line 550-*b* with the capacitors 545-*a*. The capacitance provided by a set of capacitors may be referred to in some examples as the capacitive load or the combined capacitance.

Although providing a fixed capacitive load may be suitable for some applications, other applications may benefit from the ability to vary the capacitive load. In such applications, the connection between a voltage generation component 525 and the capacitors 545-*a* may be configurable. In one example, switching components disposed (e.g., placed) along the conductive lines 550 may be used to modify which voltage generation component 525 is connected to the capacitors 545-*a*. For example, deactivating switching components coupled with the conductive lines 550 may disconnect the capacitors 545-*a* from the voltage generation component 525-*a* and activating switching components coupled with the conductive lines 550 may connect the capacitors 545-*a* to the voltage generation component 525-*n*.

Additionally or alternatively, one or more switching components may be used to modify which capacitors 545-*a* are connected to a voltage generation component 525. In some examples, the capacitors 545-*a* may include one or more sets of capacitors that are configured in parallel. For example, the set 555 may include capacitor 545-*a*-1, capacitor 545-*a*-2, and capacitor 545-*a*-3. The capacitance provided by the set 555 can be changed by modifying the quantity of capacitors connected in parallel. For example, the set 555 may provide a first capacitive load when two capacitors, capacitor 545-*a*-1 and capacitor 545-*a*-2, are connected in parallel. And the set 555 may provide a second (e.g., larger) capacitive load when three capacitors, capacitor 545-*a*-1, capacitor 545-*a*-2, and capacitor 545-*a*-3, are connected in parallel. Thus, the capacitive load provided by a set of capacitors may be increased by increasing the quantity of capacitors connected in parallel and decrease by decreasing the quantity of capacitors connected in parallel.

In some cases, the quantity of capacitors connected in parallel may be changed by modifying the state of one or more switching components 560 coupled with the conductive lines 550. For example, the capacitor 545-*a*-3 may be connected in parallel with the capacitor 545-*a*-1 and the capacitor 545-*a*-2 by activating the switching components 560, which may be part of an anti-fuse control circuit that enables programming in the factory or field. And the capacitors 545-*a*-3 may be disconnected (e.g., isolated) from the capacitor 545-*a*-1 and the capacitor 545-*a*-2 by deactivating the switching components 560. Thus, the capacitance provided by a set of capacitors may be modified by changing the active state of switching components coupled with the capacitors. Although three capacitors 545-*a* are shown in the set 555, a set of capacitors can include any number of capacitors 545-*a*, including one capacitor. Also, the capacitors in a set may be arranged in any configuration and are not limited to a parallel configuration.

In some examples, the conductive lines 550 may be strategically placed (e.g., disposed) so that cross-coupling between other conductive lines is reduced. For example, the device 500 may include conductive lines that are configured to carry information (e.g., data, commands, metadata, addresses, etc.) between the first die 505 and the second die 510. The conductive lines may be stand-alone communication paths (e.g., the conductive lines 570) or grouped together in buses 565. The information sent over the conductive lines 570 may be represented by signals transmitted by an I/O interface (e.g., I/O interface 575-*a*) on one die and received and processed by an I/O interface (e.g., I/O interface 575-*b*) on the other die. But the fluctuation of a signal on one conductive line (e.g., the aggressor) may interfere with the signal on a nearby conductive line (e.g., the victim). Such a phenomenon may be referred to a cross-coupling or cross-talk and may negatively impact performance of the device 500.

To mitigate cross-coupling, a conductive line 550 may be placed between multiple conductive lines 570 that would otherwise experience cross-coupling. For example, a conductive line 550 may be placed between the conductive line 570-*a* and the conductive line 570-*b* so that interference caused by voltage fluctuations on the conductive lines 570 is reduced. Thus, the conductive line 550 may serve as a shield between the conductive lines 570 due to the relatively static voltage on the conductive line 550. In some cases, the portion of the conductive line 550 that acts as a shield may be the portion of the conductive line that traverses the substrate 430 in the x-y plane, as shown in FIG. 3. Thus, in some examples, the conductive lines 550 may mitigate cross-coupling in addition to enabling voltage regulation by the capacitors 545-*a*.

Figure 6:
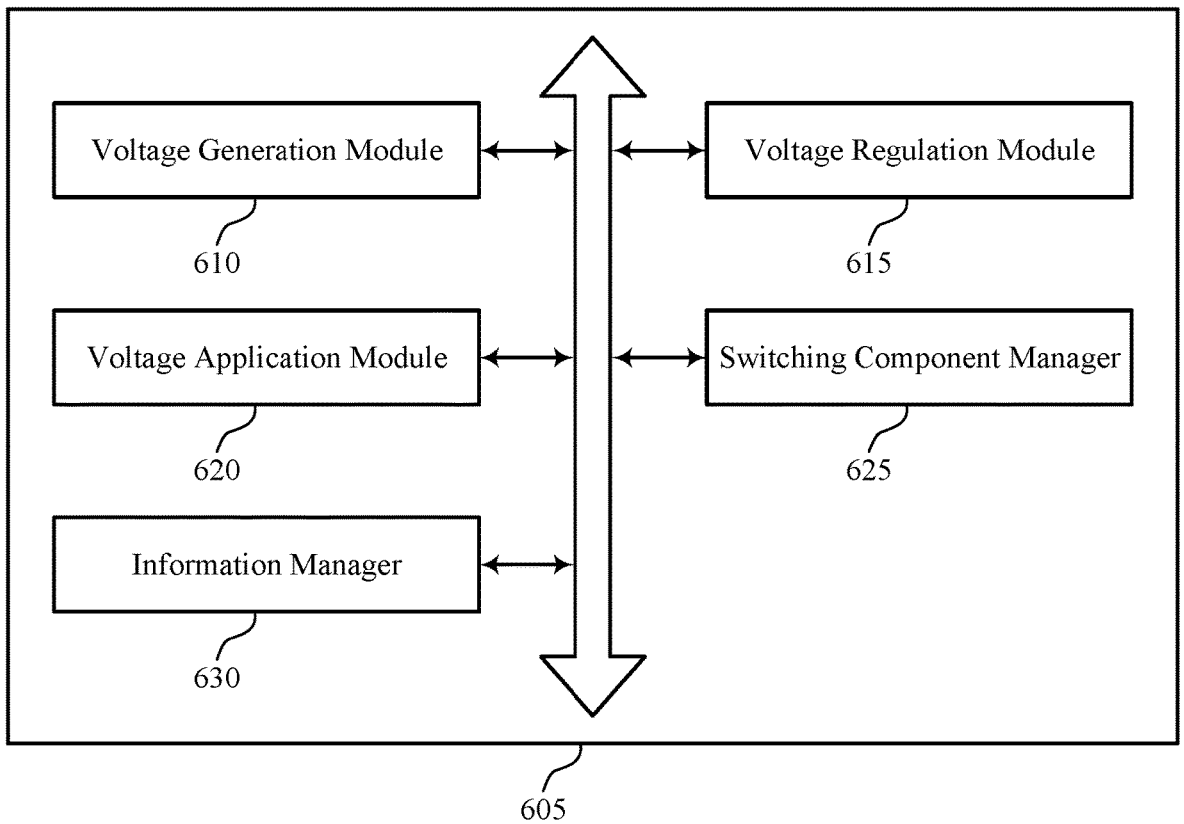
FIG. 6 shows a block diagram of a device that supports die voltage regulation in accordance with aspects of the present disclosure.

FIG. 6 shows a block diagram 600 of a device 605 that supports die voltage regulation in accordance with examples as disclosed herein. The device 605 may be an example of the device 400 or the device 500 as described with reference to FIGS. 4 and 5, respectively. The device 605 may be configured so that voltages generated on a first die of the device 605 are regulated by capacitors on the second die of the device. The device 605 may include a voltage generation module 610, a voltage regulation module 615, a voltage application module 620, a switching component manager 625, and an information manager 630. Each of these modules may include circuitry configured to perform the functions described herein. Each of these modules may communicate, directly or indirectly, with one another (e.g., via one or more buses or other conductive connections).

The voltage generation module 610 may generate a voltage at a first component disposed on a first die. The voltage regulation module 615 may regulate the voltage using a capacitor coupled with the first component through a conductive line. The capacitor may be disposed on a second die that includes a plurality of memory cells that include capacitors. In some examples, regulating the voltage occurs while the capacitor is isolated from the plurality of memory cells. In some examples, regulating the voltage includes maintaining a level of the voltage within a threshold range. The voltage application module 620 may apply the voltage regulated by the capacitor to one or more components disposed on the first die. In some examples, applying the voltage includes activating one or more switching components to transfer the voltage to one or more components of the first die.

In some examples, the capacitor is included in a first set of capacitors for regulating the voltage generated by the first component. In such examples, the voltage generation module 610 may generate a second voltage at a second component disposed on the first die. The voltage regulation module 615 may regulate the second voltage using a second set of capacitors isolated from the plurality of memory cells and coupled with the second component through a second conductive line. The voltage application module 620 may activate a switching component coupled with the conductive line, the second conductive line, or a combination thereof to select the first set of capacitors, the second set of capacitors, or a combination thereof.

The switching component manager 625 may modify a capacitive load coupled with the first component, where the capacitive load is based at least in part on the capacitor. In some examples, the switching component manager 625 may modify a state of a switching component coupled with the conductive line to modify a quantity of capacitors that are connected in parallel from a first quantity to a second quantity.

The information manager 630 may transmit information between the first and second dies over a second conductive line. The information manager 630 may also transmit information between the first and second dies over a third conductive line, where the conductive line is disposed between the second and third conductive lines.

Figure 7:
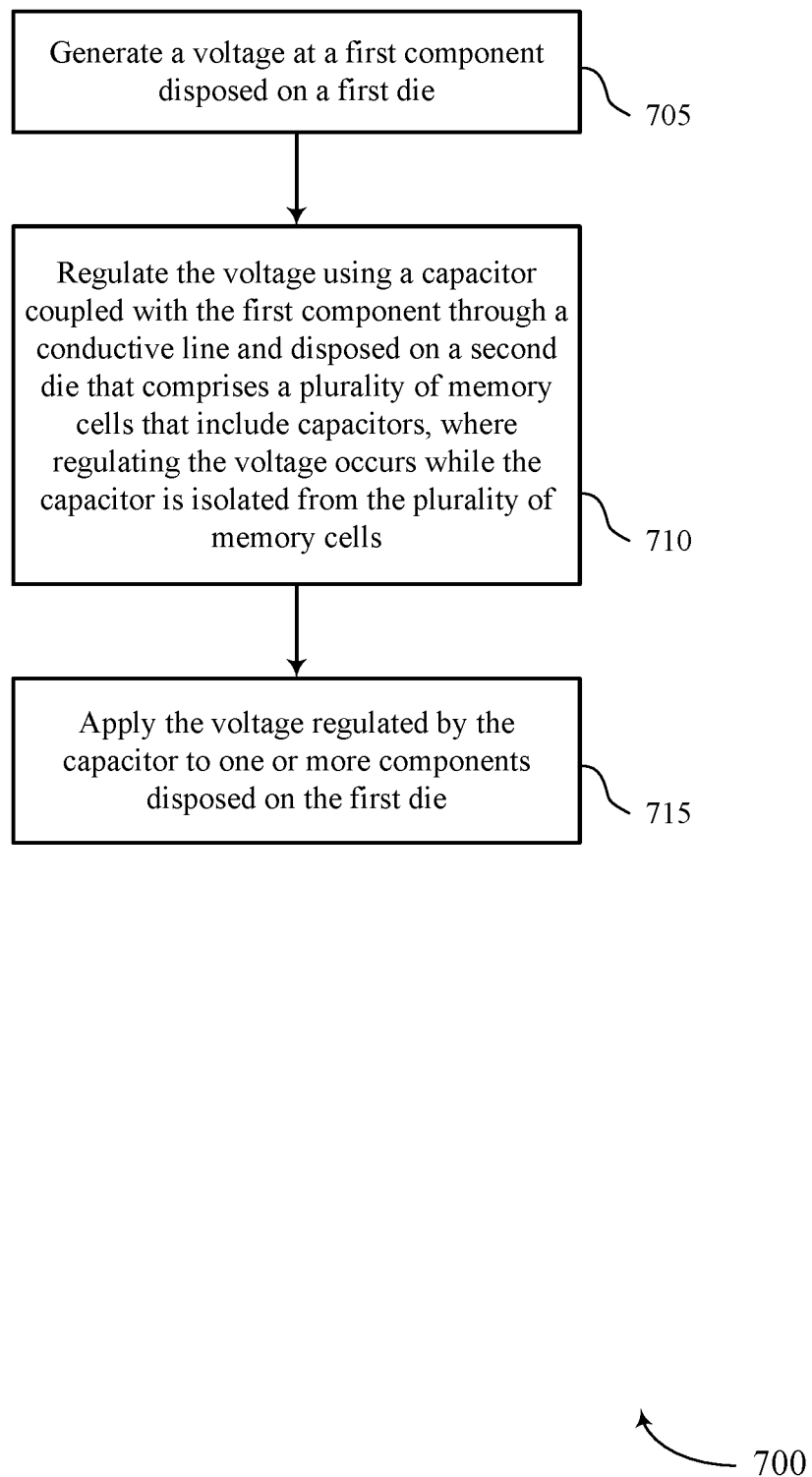
FIG. 7 shows a flowchart illustrating a method that supports die voltage regulation in accordance with examples as disclosed herein.

FIG. 7 shows a flowchart illustrating a method or methods 700 that supports die voltage regulation in accordance with examples as disclosed herein. The operations of method 700 may be implemented by a device or its components as described herein. For example, the operations of method 700 may be performed by a device as described with reference to FIGS. 1 through 6. In some examples, a device may execute a set of instructions to control the functional elements of the device to perform the described functions. Additionally or alternatively, a device may perform aspects of the described functions using special-purpose hardware.

At 705, the method may include generating a voltage at a first component disposed on a first die. The memory address may be associated with a set of memory cells in a bank of the volatile memory. The operations of 705 may be performed according to the methods described herein. In some examples, aspects of the operations of 705 may be performed by a voltage generation module as described with reference to FIG. 6.

At 710, the method may include regulating the voltage using a capacitor coupled with the first component through a conductive line and disposed on a second die that comprises a plurality of memory cells that include capacitors, where regulating the voltage occurs while the capacitor is isolated from the plurality of memory cells. In some examples, regulating the voltage includes maintaining a level of the voltage within a threshold range. The operations of 710 may be performed according to the methods described herein. In some examples, aspects of the operations of 710 may be performed by a voltage regulation module as described with reference to FIG. 6.

At 715, the method may include applying the voltage regulated by the capacitor to one or more components disposed on the first die. In some examples, applying the voltage includes activating one or more switching components to transfer the voltage to one or more components of the first die. The operations of 715 may be performed according to the methods described herein. In some examples, aspects of the operations of 715 may be performed by a voltage application module as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for generating a voltage at a first component disposed on a first die; regulating the voltage using a capacitor coupled with the first component through a conductive line and disposed on a second die that comprises a plurality of memory cells that include capacitors, where regulating the voltage occurs while the capacitor is isolated from the plurality of memory cells; and applying the voltage regulated by the capacitor to one or more components disposed on the first die.

In some examples, the capacitor is included in a first set of capacitors for regulating the voltage generated by the first component. Accordingly, some examples of the method 700 and the apparatus described herein may further include operations, features, means, or instructions for generating a second voltage at a second component disposed on the first die; and regulating the second voltage using a second set of capacitors isolated from the plurality of memory cells and coupled with the second component through a second conductive line. Some examples of the method 700 and the apparatus described herein may further include operations, features, means, or instructions for activating a switching component coupled with the conductive line, the second conductive line, or a combination thereof to select the first set of capacitors, the second set of capacitors, or a combination thereof.

Some examples of the method 700 and the apparatus described herein may further include operations, features, means, or instructions for modifying a capacitive load coupled with the first component, wherein the capacitive load is based at least in part on the capacitor. Some examples of the method 700 and the apparatus described herein may further include operations, features, means, or instructions for modifying a state of a switching component coupled with the conductive line to modify a quantity of capacitors that are connected in parallel from a first quantity to a second quantity.

Some examples of the method 700 and the apparatus described herein may further include operations, features, means, or instructions for transmitting information between the first and second dies over a second conductive line; and transmitting information between the first and second dies over a third conductive line, wherein the conductive line is disposed between the second and third conductive lines.

In some examples, an apparatus as described herein may perform aspects of method 700. The apparatus may include a first die comprising a component configured to generate a voltage for use by the first die; a second die comprising a volatile memory, the volatile memory comprising memory cells and a capacitor that is isolated from the memory cells, where the memory cells comprise capacitors; and a conductive line coupling the capacitor of the second die and the component configured to generate the voltage for use by the first die.

In some examples, the apparatus includes a substrate below the first die and the second die, where a section of the conductive line passes through the substrate in a first direction. In some examples, the apparatus includes an insulative material between the substrate and the first and second dies, where a second section of the conductive line passes through the insulative material in a second direction different than the first direction.

In some examples, the apparatus includes a second conductive line (e.g., conductive line 440-*a*) coupling the first die to a first conductive pad of the substrate; and a third conductive line (e.g., conductive line 440-*b*) coupling the second die to a second conductive pad of the substrate, where the conductive line (e.g., conductive line 445) is disposed beneath the first and second dies and a transverse section of the conductive line is disposed above a transverse section of the second conductive line and a transverse section of the third conductive line.

In some examples of the apparatus, the second die includes circuitry (e.g., access circuitry 540) configured to access the memory cells of the volatile memory, wherein the capacitor is isolated from the circuitry.

In some examples of the apparatus, the conductive line couples a first terminal of the capacitor with the component. In such examples, the apparatus may include a second conductive line coupling a second terminal of the capacitor with the component.

In some examples of the apparatus, the second die may include a second capacitor (e.g., capacitor 545-$a$-2) isolated from the memory cells and in parallel with the capacitor, where the conductive line couples the second capacitor to the component.

In some examples, the apparatus may include a second conductive line (e.g., conductive line 570-$a$) configured to transfer information between the first die and the second die; and a third conductive line (e.g., conductive line 570-$b$) configured to transfer information between the first die and the second die, where the conductive line is disposed between the second and third conductive lines.

In some examples, the apparatus may include a switching component (e.g., switching component 560) disposed along the conductive line and configured to modify a capacitive load that is based at least in part on the capacitor.

In some examples of the apparatus, the first die comprises a logic die or a non-volatile memory die and the second die comprises a DRAM die.

In some examples, an apparatus as described herein may perform aspects of method 700. The apparatus may include a substrate in contact with a plurality of conductive pads; an insulative material disposed on the substrate; a first die at least partially surrounded by the insulative material and coupled with a first conductive pad of the plurality of conductive pads by a first conductive line (e.g., conductive line 440-$a$), the first die comprising a component configured to generate voltage for the first die; a second die at least partially surrounded by the insulative material and coupled with a second conductive pad of the plurality of conductive pads by a second conductive line (e.g., conductive line 440-$b$), the second die comprising a volatile memory that comprises a plurality of capacitors configured as memory cells and comprising a capacitor that is isolated from the plurality of capacitors; and a third conductive line (e.g., conductive line 445) that is coupled with the component configured to generate voltage for the first die and the capacitor of the second die that is isolated from the plurality of capacitors configured as memory cells.

In some examples of the apparatus, a transverse portion of the third conductive line is below the first and second dies and above transverse portions of the first and second conductive lines.

In some examples of the apparatus, the third conductive line is disposed through the insulative material in a first direction and disposed through the substrate in a second direction perpendicular to the first direction.

In some examples of the apparatus, the third conductive line couples a first terminal of the capacitor with the component. In such examples, the apparatus may include a fourth conductive line coupling a second terminal of the capacitor with the component.

It should be noted that the methods described above describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

A protocol may define one or more communication procedures and one or more communication parameters supported for use by a device or component. For example, a protocol may define various operations, a timing and a frequency for those operations, a meaning of various commands or signals or both, one or more addressing scheme(s) for one or more memories, a type of communication for which pins are reserved, a size of data handled at various components such as interfaces, a data rate supported by various components such as interfaces, or a bandwidth supported by various components such as interfaces, among other parameters and metrics, or any combination thereof. Use of a shared protocol may enable interaction between devices because each device may operate in a manner expected, recognized, and understood by another device. For example, two devices that support the same protocol may interact according to the policies, procedures, and parameters defined by the protocol, whereas two devices that support different protocols may be incompatible.

To illustrate, two devices that support different protocols may be incompatible because the protocols define different addressing schemes (e.g., different quantities of address bits). As another illustration, two devices that support different protocols may be incompatible because the protocols define different transfer procedures for responding to a single command (e.g., the burst length or quantity of bytes permitted in response to the command may differ). Merely translating a command to an action should not be construed as use of two different protocols. Rather, two protocols may be considered different if corresponding procedures or parameters defined by the protocols vary. For example, a device may be said to support two different protocols if the device supports different addressing schemes, or different transfer procedures for responding to a command.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first die comprising a component configured to generate a voltage for use by the first die;
a second die comprising a volatile memory, the volatile memory comprising memory cells and a capacitor that is isolated from the memory cells, wherein the memory cells comprise capacitors; and
a conductive line coupling the capacitor of the second die and the component configured to generate the voltage for use by the first die.

2. The apparatus of claim 1, further comprising:
a substrate below the first die and the second die, wherein a section of the conductive line passes through the substrate in a first direction.

3. The apparatus of claim 2 further comprising:
an insulative material between the substrate and the first and second dies, wherein a second section of the conductive line passes through the insulative material in a second direction different than the first direction.

4. The apparatus of claim 2, further comprising:
a second conductive line coupling the first die to a first conductive pad of the substrate; and
a third conductive line coupling the second die to a second conductive pad of the substrate, wherein the conductive line is disposed beneath the first and second dies and a transverse section of the conductive line is disposed above a transverse section of the second conductive line and a transverse section of the third conductive line.

5. The apparatus of claim 1, wherein the second die comprises:
circuitry configured to access the memory cells of the volatile memory, wherein the capacitor is isolated from the circuitry.

6. The apparatus of claim 1, wherein the conductive line couples a first terminal of the capacitor with the component, the apparatus further comprising:
a second conductive line coupling a second terminal of the capacitor with a ground reference.

7. The apparatus of claim 1, wherein the second die comprises:
a second capacitor isolated from the memory cells and in parallel with the capacitor, wherein the conductive line couples the second capacitor to the component.

8. The apparatus of claim 1, further comprising:
a second conductive line configured to transfer information between the first die and the second die; and
a third conductive line configured to transfer information between the first die and the second die, wherein the conductive line is disposed between the second and third conductive lines.

9. The apparatus of claim 1, further comprising:
a switching component disposed along the conductive line and configured to modify a capacitive load that is based at least in part on the capacitor.

10. The apparatus of claim 1, wherein the first die comprises a logic die or a non-volatile memory die, and wherein the second die comprises a dynamic random access memory (DRAM) die.

11. A method, comprising:
generating a voltage at a first component disposed on a first die;
regulating the voltage using a capacitor coupled with the first component through a conductive line and disposed on a second die that comprises a plurality of memory cells that include capacitors, wherein regulating the voltage occurs while the capacitor is isolated from the plurality of memory cells; and
applying the voltage regulated by the capacitor to one or more components disposed on the first die.

12. The method of claim 11, wherein the capacitor is included in a first set of capacitors for regulating the voltage generated by the first component, the method further comprising:
generating a second voltage at a second component disposed on the first die; and
regulating the second voltage using a second set of capacitors isolated from the plurality of memory cells and coupled with the second component through a second conductive line.

13. The method of claim 12, further comprising:
activating a switching component coupled with the conductive line, the second conductive line, or a combination thereof to select the first set of capacitors, the second set of capacitors, or a combination thereof.

14. The method of claim 11, further comprising:
modifying a capacitive load coupled with the first component, wherein the capacitive load is based at least in part on the capacitor.

15. The method of claim 14, further comprising:
modifying a state of a switching component coupled with the conductive line to modify a quantity of capacitors that are connected in parallel from a first quantity to a second quantity.

16. The method of claim 11, further comprising:
transmitting information between the first and second dies over a second conductive line; and transmitting information between the first and second dies over a third conductive line, wherein the conductive line is disposed between the second and third conductive lines.

17. The method of claim 11, wherein regulating the voltage comprises maintaining a level of the voltage within a threshold range.

18. The method of claim 11, wherein applying the voltage comprises:
    activating one or more switching components to transfer the voltage to one or more components of the first die.

19. An apparatus, comprising:
    a substrate in contact with a plurality of conductive pads;
    an insulative material disposed on the substrate;
    a first die at least partially surrounded by the insulative material and coupled with a first conductive pad of the plurality of conductive pads by a first conductive line, the first die comprising a component configured to generate voltage for the first die;
    a second die at least partially surrounded by the insulative material and coupled with a second conductive pad of the plurality of conductive pads by a second conductive line, the second die comprising a volatile memory that comprises a plurality of capacitors configured as memory cells and comprising a capacitor that is isolated from the plurality of capacitors; and
    a third conductive line that is coupled with the component configured to generate voltage for the first die and the capacitor of the second die that is isolated from the plurality of capacitors configured as memory cells.

20. The apparatus of claim 19, wherein a transverse portion of the third conductive line is below the first and second dies and above transverse portions of the first and second conductive lines.

21. The apparatus of claim 19, wherein the third conductive line is disposed through the insulative material in a first direction and disposed through the substrate in a second direction perpendicular to the first direction.

22. The apparatus of claim 19, further comprising:
    a second capacitor isolated from the plurality of capacitors and in parallel with the capacitor.

23. The apparatus of claim 19, wherein the third conductive line couples a first terminal of the capacitor with the component, the apparatus further comprising:
    a fourth conductive line coupling a second terminal of the capacitor with the component.

* * * * *